United States Patent
Xu

(10) Patent No.: US 9,129,751 B2
(45) Date of Patent: Sep. 8, 2015

(54) HIGHLY EFFICIENT DYE-SENSITIZED SOLAR CELLS USING MICROTEXTURED ELECTRON COLLECTING ANODE AND NANOPOROUS AND INTERDIGITATED HOLE COLLECTING CATHODE AND METHOD FOR MAKING SAME

(75) Inventor: Tao Xu, Lisle, IL (US)

(73) Assignee: Northern Illinois University, DeKalb, IL (US)

( * ) Notice: Subject to any disclaimer, the term of this patent is extended or adjusted under 35 U.S.C. 154(b) by 632 days.

(21) Appl. No.: 12/748,856

(22) Filed: Mar. 29, 2010

(65) Prior Publication Data

US 2011/0232759 A1    Sep. 29, 2011

(51) Int. Cl.
| | |
|---|---|
| H01L 31/042 | (2014.01) |
| H01G 9/20 | (2006.01) |
| H01L 31/0224 | (2006.01) |
| H01L 31/0352 | (2006.01) |

(52) U.S. Cl.
CPC ............. *H01G 9/2022* (2013.01); *H01G 9/209* (2013.01); *H01G 9/2068* (2013.01); *H01L 31/022425* (2013.01); *H01L 31/0352* (2013.01); *H01G 9/2031* (2013.01); *H01G 9/2059* (2013.01); *Y02E 10/542* (2013.01)

(58) Field of Classification Search
CPC . H01G 9/2022; H01G 9/2068; H01G 9/2059; H01G 9/209; H01G 9/2031; H01L 31/022425; H01L 31/0352; Y02E 10/542
USPC ................................................. 136/256, 255
See application file for complete search history.

(56) References Cited

U.S. PATENT DOCUMENTS

| | | | |
|---|---|---|---|
| 5,482,570 A | 1/1996 | Saurer et al. | |
| 7,145,071 B2 * | 12/2006 | Spivack et al. | 136/263 |
| 2003/0000568 A1 * | 1/2003 | Gonsiorawski | 136/251 |
| 2003/0230337 A1 * | 12/2003 | Gaudiana et al. | 136/256 |
| 2004/0131934 A1 | 7/2004 | Sugnaux et al. | |
| 2005/0072458 A1 * | 4/2005 | Goldstein | 136/251 |
| 2005/0109391 A1 * | 5/2005 | Kobayashi | 136/263 |
| 2005/0175939 A1 | 8/2005 | Perlo et al. | |
| 2005/0218381 A1 * | 10/2005 | Maruyama et al. | 252/500 |
| 2005/0274888 A1 * | 12/2005 | Darling et al. | 250/305 |
| 2007/0217784 A1 | 9/2007 | Kaneiwa et al. | |
| 2008/0149171 A1 * | 6/2008 | Lu et al. | 136/252 |
| 2008/0308156 A1 * | 12/2008 | Boyer, Jr. | 136/262 |
| 2009/0211630 A1 * | 8/2009 | Yun et al. | 136/256 |
| 2011/0214730 A1 | 9/2011 | Kobayashi et al. | |
| 2011/0232736 A1 * | 9/2011 | Goldstein et al. | 136/256 |
| 2011/0232759 A1 | 9/2011 | Xu | |

(Continued)

FOREIGN PATENT DOCUMENTS

| | | |
|---|---|---|
| EP | 1320782 | 12/2010 |
| JP | 5489497 | 7/1979 |

(Continued)

OTHER PUBLICATIONS

Takagi, "Mechanism of Gold Catalyzed Carbon Material Growth", Feb. 2008, Nano Letters, vol. 8 No. 3, pp. 832-835.*

(Continued)

*Primary Examiner* — Devina Pillay
(74) *Attorney, Agent, or Firm* — Evan Law Group LLC

(57) ABSTRACT

The present invention generally relates to the field of photovoltaic devices. Specifically, the present invention relates to the areas of dye sensitized solar cells (DSSCs).

19 Claims, 4 Drawing Sheets

(56) References Cited

U.S. PATENT DOCUMENTS

| | | |
|---|---|---|
| 2013/0065130 A1 | 3/2013 | Ban et al. |
| 2013/0160855 A1 | 6/2013 | Gibson et al. |
| 2015/0055206 A1 | 2/2015 | Xu |

FOREIGN PATENT DOCUMENTS

| | | | | |
|---|---|---|---|---|
| JP | 5710122 | 1/1982 | | |
| JP | 5830731 | 2/1983 | | |
| JP | 61254935 | 11/1986 | | |
| WO | WO2009027977 | * 3/2009 | ........... | H01G 9/2022 |
| WO | 2012/001033 | 1/2012 | | |

OTHER PUBLICATIONS

Yang, Z. et al., "Three-dimensional photonic crystal fluorinated tin oxide (FTO) electrodes: synthesis and optical and electrical properties", Applied Materials & Interfaces, vol. 3, pp. 1101-1108, (2011).

Yang, Z. et al., "Enhanced electron extraction from template-free 3D nanoparticulate transparent conducting oxide (TCO) electrodes for dye-sensitized solar cells", Applied Materials & Interfaces, vol. 4, pp. 4419-4427, (2012).

Yang, Z. et al., "Enhanced electron collection in $TiO_2$ nanoparticle-based dye-sensitized solar cells by an array of metal micropillars on a planar fluorinated tin oxide anode", Journal of Physical Chemistry C, vol. 114, No. 44, pp. 19151-19156, (2010).

Lin, C. et al., "An in situ electrical study on primary hydrogen spillover from nanocatalysts to amorphous carbon support", Applied Physics Letters, vol. 93, pp. 233110-1-233110-3, (2008).

Yang, Z. et al., "Enhanced electron transport in dye-sensitized solar cells using short ZnO nanotips on a rough metal anode", The Journal of Physical Chemistry C, vol. 113, No. 47, pp. 20521-20526, (2009).

Gratzel, M., "Photoelectrochemical cells", Nature, vol. 414, pp. 338-344, (2001).

Hamann, T.W. et al., "Advancing beyond current generation dye-sensitized solar cells", Energy and Environmental Science, vol. 1, pp. 66-78, (2008).

O'Regan, B. et al., "A low-cost, high-efficiency solar-cell based on dye-sensitized colloidal $TiO_2$ films", Nature, vol. 353, pp. 737-740, (1991).

Peter, L., ""Sticky electrons" transport and interfacial transfer of electrons in the dye-sensitized solar cell", Accounts of Chemical Research, vol. 42, No. 11, pp. 1839-1847, (2009).

Boschloo, G. et al., "Characteristics of the Iodide/triiodide redox mediator in dye-sensitized solar cells", Accounts of Chemical Research, vol. 42, No. 11, pp. 1819-1826, (2009).

Papageorgiou, N. et al., "On the relevance of mass transport in thin layer nanocrystalline photoelectrochemical solar cells", Solar Energy Materials and Solar Cells, vol. 44, pp. 405-438, (1996).

Papageorgiou, N. et al., "Morphology and adsorbate dependence of ionic transport in dye sensitized mesoporous $TiO_2$ films", Journal of Physical Chemistry B, vol. 102, pp. 4156-4164, (1998).

Junghanel, M. et al., "Role of nanochemical environments in porous $TiO_2$ in photocurrent efficiency and degradation in dye sensitized solar cells", Journal of Physical Chemistry B, vol. 109, pp. 22876-22883, (2005).

Hagfeldt, A. et al., "Dye-Sensitized Solar Cells", Chemical Review, vol. 110, pp. 6595-6663, (2010).

Peter, L.M., "Characterization and modeling of dye-sensitized solar cells", Journal of Physical Chemistry C, vol. 111, pp. 6601-6612, (2007).

Frank, A.J. et al., "Electrons in nanostructured $TiO_2$ solar cells: transport, recombination and photovoltaic properties", Coordination Chemistry Reviews, vol. 248, pp. 1165-1179, (2004).

Kopidakis, N. et al., "Ambipolar diffusion of photocarriers in electrolyte-filled, nanoporous $TiO_2$", Journal of Physical Chemistry B, vol. 104, pp. 3930-3936, (2000).

Kron, G. et al., "Electronic transport in dye-sensitized nanoporous $TiO_2$ solar cells—comparision of electrolyte and solid-state devices", Journal of Physical Chemistry B, vol. 107, pp. 3556-3564, (2003).

Shockley, W. et al., "Detailed balance limit of efficiency of p-n junction solar cells", Journal of Applied Physics, vol. 32, No. 3, pp. 510-519, (1961).

Tisdale, W.A. et al., "Hot-electron transfer from semiconductor nanocrystals", Science, vol. 328, pp. 1543-1547, (2010).

Ross, R.T. et al., "Efficiency of hot-carrier solar energy converters", Journal of Applied Physics, vol. 53, No. 5, 3813-3818, (1982).

Nazeeruddin, M.K. et al., "Combined experimental and DFT-TDDFT computational study of photoelectrochemical cell ruthenium sensitizers", Journal of the American Chemical Society, vol. 127, pp. 16835-16847, (2005).

Schlichthorl, G. et al., "Evaluation of the charge-collection efficiency of dye-sensitized nanocrystalline $TiO_2$ solar cells", Journal of Physical Chemistry B, vol. 103, pp. 782-791, (1999).

Zhu, K. et al., "Enhanced charge-collection efficiencies and light scattering in dye-sensitized solar cells using oriented $TiO_2$ nanotubes arrays", Nano Letters, vol. 7, No. 1, pp. 69-74, (2007).

Redmond, G. et al., "Effect of surface chelation on the energy of an intraband surface state of a nanocrystalline $TiO_2$ film", Journal of Physical Chemistry, vol. 97, pp. 6951-6954, (1993).

Boschloo, G. et al., "Spectroelectrochemical investigation of surface states in nanostructured $TiO_2$ electrodes", Journal of Physical Chemistry, vol. 103, pp. 2228-2231, (1999).

Boschloo, G.K. et al., "Electron trapping in porphyrin-sensitized porous nanocrystalline $TiO_2$ electrodes" Journal of Physical Chemistry, vol. 100, pp. 19489-19494, (1996).

Wang, H. et al., "Electrochemical investigation of traps in a nanostructured $TiO_2$ film", Journal of Physical Chemistry, vol. 105, pp. 2529-2533, (2001).

Chiba, Y. et al., "Dye-sensitized solar cells with conversion efficiency of 11.1%", Japanese Journal of Applied Physics, vol. 45, No. 25, pp. L638-L640, (2006).

Gratzel, M., "Solar energy conversion by dye-sensitized photovoltaic cells", Inorganic Chemistry, vol. 44, pp. 6841-6851, (2005).

Bisquert, J. et al., "The trap-limited diffusivity of electrons in nanoporous semiconductor networks permeated with a conductive phase", Applied Physics A: Materials Science & Processing, vol. 77, pp. 507-514, (2003).

Hengerer, R. et al., "Orientation dependence of charge-transfer processes on $TiO_2$ (Anatase) single crystals", Journal of the Electrochemical Society, vol. 147, No. 4, pp. 1467-1472, (2000).

Grimes, C.A., "Synthesis and application of highly ordered arrays of $TiO_2$ nanotubes", Journal of Materials Chemistry, vol. 17, pp. 1451-1457, (2007).

Mor, G.K. et al., "Use of highly-ordered $TiO_2$ nanotube arrays in dye-sensitized solar cells", Nano Letters, vol. 6, No. 2, pp. 215-218, (2006).

Feng, X. et al., "Vertically aligned single crystal $TiO_2$ nanowire arrays grown directly on transparent conducting oxide coated glass: synthesis details and applications", Nano Letters, vol. 8, No. 11, pp. 3781-3786, (2008).

Law, M. et al., "Nanowire dye-sensitized solar cells", Nature Materials, vol. 4, pp. 455-459, (2005).

Martinson, A.B.F. et al., "ZnO nanotube based dye-sensitized solar cells", Nano Letters, vol. 7, No. 8, pp. 2183-2187, (2007).

Martinson, A.B.F. et al., "Radial electron collection in dye-sensitized solar cells", Nano Letters, vol. 8, No. 9, pp. 2862-2866, (2008).

Mora-Sero, I. et al., "Determination of carrier density of ZnO nanowires by electrochemical techniques", Applied Physics Letters, vol. 89, pp. 203117-1-203117-3, (2006).

Shankar, K. et al., "Highly efficient solar cells using $TiO_2$ nanotube arrays sensitized with a donor-antenna dye", Nano Letters, vol. 8, No. 6, pp. 1654-1659, (2008).

Kim, D. et al., "Bamboo-type $TiO_2$ nanotubes: Improved conversion efficiency in dye-sensitized solar cells", Journal of the American Chemical Society, vol. 130, pp. 16454-16455, (2008).

Paulose, M. et al., "Application of highly-ordered $TiO_2$ nanotube-arrays in heterojunction dye-sensitized solar cells", Journal of Physics D: Applied Physics, vol. 39, pp. 2498-2503, (2006).

Liu, B. et al., "Growth of oriented single-crystalline rutile $TiO_2$ nanorods on transparent conducting substrates for dye-sensitized solar cells", Journal of the American Chemical Society, vol. 131, pp. 3985-3990, (2009).

(56) References Cited

OTHER PUBLICATIONS

Shankar, K. et al., "Recent advances in the use of $TiO_2$ nanotube and nanowire arrays for oxidative photoelectrochemistry", Journal of Physical Chemistry C, vol. 113, pp. 6327-6359, (2009).
Martinson, A.B.F. et al., "Electron transport in dye-sensitized solar cells based on ZnO nanotubes: Evidence for highly efficient charge collection and exceptionally rapid dynamics", Journal of Physical Chemistry A, vol. 113, pp. 4015-4021, (2009).
Jennings, J.R. et al., "Dye-sensitized solar cells based on oriented $TiO_2$ nanotube arrays: transport, trapping, and transfer of electrons", Journal of the American Chemical Society, vol. 130, pp. 13364-13372, (2008).
Martinson, A.B.F. et al., "Dynamics of charge transport and recombination in ZnO nanorod array dye-sensitized solar cells", Physical Chemistry Chemical Physics, vol. 8, pp. 4655-4659, (2006).
Martinson, A.B.F. et al., "New architectures for dye-sensitized solar cells", Chemistry: A European Journal, vol. 14, pp. 4458-4467, (2008).
Asano, T. et al., "Short-circuit current density behavior of dye-sensitized solar cells", Japanese Journal of Applied Physics, vol. 44, No. 9A, pp. 6776-6780, (2005).
Chen, H.H. et al., "Dye-sensitized solar cells using ZnO nanotips and Ga-doped ZnO films", Semiconductor Science and Technology, vol. 23, pp. 045004-1-045004-6, (2008).
Clifford, J.N. et al., "Dye dependent regeneration dynamics in dye sensitized nanocrystalline solar cells: Evidence for the formation of a ruthenium bipyridyl cation/iodide intermediate", Journal of Physical Chemistry, vol. 111, pp. 6561-6567, (2007).
Gregg, B.A. et al., "Interfacial recombination processes in dye-sensitized solar cells and methods to passivate the interfaces", Journal of Physical Chemistry B, vol. 105, pp. 1422-1429, (2001).
Ito, S. et al., "Bifacial dye-sensitized solar cells based on an ionic liquid electrolyte", Nature Photonics, vol. 2, pp. 693-698, (2008).
Kang, M.G. et al., "Dependence of $TiO_2$ film thickness on photocurrent-voltage characteristics of dye-sensitized solar cells", Bull. Korean Chemical Society, vol. 25, No. 5, pp. 742-744, (2004).
O'Regan, B.C. et al., "Catalysis of recombination and its limitation on open circuit voltage for dye sensitized photovoltaic cells using phthalocyanine dyes", Journal of the American Chemical Society, vol. 130, pp. 2906-2907, (2008).
Splan, K.E. et al., "A porous multilayer dye-based photoelectrochemical cell that unexpectedly runs in reverse", Journal of Physical Chemistry B, vol. 108, pp. 4111-4115, (2004).
Paulose, M. et al., "$TiO_2$ nanotube arrays of 1000 pm length by anodization of titanium foil: Phenol red diffusion", Journal of Physical Chemistry C, vol. 111, pp. 14992-14997, (2007).
Hoffmann, M.R. et al., "Environmental applications of semiconductor photocatalysis", Chemical Review, vol. 95, pp. 69-96, (1995).
Linsebigler, A.L. et al., "Photocatalysis on $TiO_2$ surfaces: Principles, mechanisms, and selected results", Chemical Review, vol. 95, pp. 735-758, (1995).
Thompson, T.L. et al., "Surface science studies of the photoactivation of $TiO_2$—new photochemical processes", Chemical Review, vol. 106, pp. 4428-4453, (2006).
Alvaro, M. et al., "Photocatalytic activity of structured mesoporous $TiO_2$ materials", Journal of Physical Chemistry B, vol. 110, pp. 6661-6665, (2006).
He, D.P. et al., "Preparation and photocatalytic activity of anatase $TiO_2$ nanocrystallites with high thermal stability", Materials Letters, vol. 61, pp. 3385-3387, (2007).
Finazzi, E. et al., "Boron-doped anatase $TiO_2$: Pure and hybrid DFT calculations", Journal of Physical Chemistry C, vol. 113, pp. 220-228, (2009).
Gopal, N.O. et al., "Chemical state and environment of boron dopant in B,N-codoped anatase $TiO_2$ nanoparticles: An avenue for probing diamagnetic dopants in $TiO_2$ by electron paramagnetic resonance spectroscopy", Journal of the American Chemical Society, vol. 130, pp. 2760-2761, (2008).
Periyat, P. et al., "Improved high-temperature stability and sun-light-driven photocatalytic activity of sulfur-doped anatase $TiO_2$", Journal of Physical Chemistry C, vol. 112, pp. 7644-7652, (2008).
Periyat, P. et al., "One-pot synthesis of anionic (nitrogen) and cationic (sulfur) codoped high-temperature stable, visible light active, anatase photocatalysts", Journal of Physical Chemistry C, vol. 113, pp. 3246-3253, (2009).
Asahi, R. et al., "Visible-light photocatalysis in nitrogen-doped titanium oxides", Science, vol. 293, pp. 269-271, (2001).
Zuo, F. et al., "Self-doped $Ti^{3+}$ enhanced photocatalyst for hydrogen production under visible light", Journal of the American Chemical Society, vol. 132, pp. 11856-11857, (2010).
Chen, X. et al., "Increasing solar absorption for photocatalysis with black hydrogenated titanium dioxide nanocrystals", Science, vol. 331, pp. 746-750, (2011).
Justicia, I. et al., "Designed self-doped titanium oxide thin films for efficient visible light photocatalysis", Advanced Materials, vol. 14, No. 19, pp. 1399-1402, (2002).
Nowotny, J. et al., "$TiO_2$ surface active sites for water splitting", Journal of Physical Chemistry B, vol. 110, pp. 18492,18495, (2006).
Cronemeyer, D.C., "Infrared absorption of reduced rutile $TiO_2$ single crystals", Physical Review, vol. 113, No. 5, pp. 1222-1226, (1959).
Teleki, A. et al., "Blue nano titania made in diffusion flames", Physical Chemistry Chemical Physics, vol. 11, pp. 3742-3747, (2009).
Komaguchi, K. et al., "Electron-transfer reaction of oxygen species on $TiO_2$ nanoparticles induced by sub-band-gap illumination", Journal of Physical Chemistry C, vol. 114, pp. 1240-1245, (2010).
Xu, T. et al., "Rectification by a monolayer of hexadecylquinolinium tricyanoquinodimethanide between gold electrodes", Angewandte Chemie International Edition, vol. 40, No. 9, pp. 1749-1752, (2001).
Metzger, R.M. et al., "Electrical rectification by a monolayer of hexadecylquinolinium tricyanoquinodimethanide measured between macroscopic gold electrodes", Journal of Physical Chemistry B, vol. 105, pp. 7280-7290, (2001).
Xu, T. et al., "A spectroscopic study of hexadecylquinolinium tricyanoquinodimethanide as a monolayer and in bulk", Journal of Physical Chemistry B, vol. 106, pp. 10374-10381, (2002).
Xu, T. et al., "Current-voltage characteristics of an LB monolayer of didecylammonium tricyanoquinodimethanide measured between macroscopic gold electrodes", Journal of Materials Chemistry, vol. 12, pp. 3167-3171, (2002).
Gao, Y. et al., "Electron transfer of carotenoids imbedded in MCM-41 and Ti-MCM-41: EPR, ENDOR and UV-Vis studies", Journal of Physical Chemistry B, vol. 106, pp. 10808-10815, (2002).
Patel, U. et al., "Origin of the matching effect in a superconducting film with a hole array", Physical Review B, vol. 76, pp. 020508-1-020508-4, (2007).
Xu, T. et al., "Self-assembled monolayer-enhanced hydrogen sensing with ultra-thin palladium films", Applied Physics Letters, vol. 86, pp. 203104-1-203104-3, (2005).
Xu, T. et al., "Periodic holes with 10 nm diameter produced by grazing Ar+ milling of the barrier layer in hexagonally ordered nanoporous alumina" Nano Letters, vol. 2, No. 1, pp. 37-41, (2002).
Xu, T. et al., "Nanoditches fabricated using a carbon nanotube as a contact mask", Nano Letters, vol. 2, No. 10, pp. 1061-1065, (2002).
Lin, C. et al., "Hydrogen spillover enhanced hydriding kinetics of palladium-doped lithium nitride to lithium imide", Journal of Physical Chemistry C, vol. 113, No. 19, pp. 8513-8517, (2009).
Xu, T. et al., "Synthesis of supported platinum nanoparticles from Li—Pt solid solution", Journal of the American Chemical Society, vol. 132, pp. 2151-2153, (2010).
Kulchytskyy, I. et al., "Direct mass determination of hydrogen uptake using a quartz crystal microbalance", Applied Physics Letters, vol. 91, pp. 113507-1-113507-3, (2007).
Chakrabarti, A. et al., "Synthesis of boron nanorods by smelting non-toxic boron oxide in liquid lithium", Journal of Nanomaterials, vol. 2010, article ID 589372, pp. 1-5, (2010).
Xu, P. et al., "$I_2$-hydrosol-seeded growth of $(I_2)_n$-C-codoped meso/nanoporous $TiO_2$ for visible light-driven photocatalysis", Journal of Physical Chemistry C, vol. 114, pp. 9510-9517, (2010).
Xu, P. et al., "Visible-light-driven photocatalytic S- and C- codoped meso/nanoporous $TiO_2$," Energy & Environmental Science, vol. 3, pp. 1128-1134, (2010).

(56) References Cited

OTHER PUBLICATIONS

O'Regan, B.C. et al., "Measuring charge transport from transient photovoltage rise times. A new tool to investigate electron transport in nanoparticle films", Journal of Physical Chemistry B, vol. 110, pp. 17155-17160, (2006).

Adachi, M. et al., "Determination of parameters of electron transport in dye-sensitized solar cells using electrochemical impedance spectroscopy", Journal of Physical Chemistry B, vol. 110, pp. 13872-13880, (2006).

van de Lagemaat, J. et al., "Influence of electrical potential distribution, charge transport, and recombination on the photopotential and photocurrent conversion efficiency of dye-sensitized nanocrystalline $TiO_2$ solar cells: A study by electrical impedance and optical modulation techniques", Journal of Physical Chemistry B, vol. 104, pp. 2044-2052, (2000).

Bisquert, J., "Theory of the impedance of electron diffusion and recombination in a thin layer", Journal of Physical Chemistry B, vol. 106, pp. 325-333, (2002).

Schwarzburg, K. et al., "Origin of photovoltage and photocurrent in the nanoporous dye-sensitized electrochemical solar cell", Journal of Physical Chemistry B, vol. 103, pp. 5743-5746, (1999).

Bisquert, J. et al., "Modelling the electric potential distribution in the dark in nanoporous semiconductor electrodes", Journal of Solid State Electrochemistry, vol. 3, pp. 337-347, (1999).

Jiang, C.Y. et al., "Improved dye-sensitized solar cells with a ZnO-nanoflower photoanode", Applied Physics Letters, vol. 90, pp. 263501-1-263501-3, (2007).

Cheng, H-M. et al., "Formation of branched ZnO nanowires from solvothermal method and dye-sensitized solar cells applications", Journal of Physical Chemistry C, vol. 112, pp. 16359-16364, (2008).

Xia, J. et al., "Deposition of a thin film of $TiO_x$ from a titanium metal target as novel blocking layers at conducting glass/$TiO_2$ interfaces in ionic liquid mesoscopic $TiO_2$ dye-sensitized solar cells", Journal of Physical Chemistry B, vol. 110, pp. 25222-25228, (2006).

Hamal, D.B. et al., "Synthesis, characterization, and visible light activity of new nanoparticle photocatalysts based on silver, carbon, and sulfur-doped $TiO_2$", Journal of Colloid and Interface Science, vol. 311, pp. 514-522, (2007).

Hahn, R. et al., "Semimetallic $TiO_2$ Nanotubes", Angewandte Chemie International Edition, vol. 48, pp. 7236-7239, (2009).

Kavan, L. et al., "Electrochemical and photoelectrochemical investigation of single-crystal anatase", Journal of the American Chemical Society, vol. 118, pp. 6716-6723, (1996).

Forro, L. et al., "High mobility n-type charge carriers in large single crystals of anatase ($TiO_2$)", Journal of Applied Physics, vol. 75, No. 1, pp. 633-635, (1994).

Wagner, P. et al., "Hall effect and anisotropy of the mobility of the electrons in zinc oxide", Journal of Physics and Chemistry of Solids, vol. 35, pp. 327-335, (1974).

Wang, A. et al., "Indium—cadmium—oxide films having exceptional electrical conductivity and optical transparency: Clues for optimizing transparent conductors", Proceedings of the National Academy of Science, vol. 98, pp. 7113-7116, (2001).

Green, A.N.M. et al., "Charge transport versus recombination in dye-sensitized solar cells employing nanocrystalline $TiO_2$ and $SnO_2$ films", Journal of Physical Chemistry B, vol. 109, pp. 12525-12533, (2005).

Peter, L.M. et al., "Dye-sensitized nanocrystalline solar cells", Physical Chemistry Chemical Physics, vol. 9, pp. 2630-2642, (2007).

Snaith, H.J. et al., "Light intensity, temperature, and thickness dependence of the open-circuit voltage in solid-state dye-sensitized solar cells", Physical Review B, vol. 74, pp. 045306-1-045306-6, (2006).

Ito, S. et al., "High-efficiency (7.2%) flexible dye-sensitized solar cells with Ti-metal substrate for nanocrystalline-$TiO_2$ photoanode", Chemical Communications, pp. 4004-4006, (2006).

Chen, H-Y. et al., "Polymer solar cells with enhanced open-circuit voltage and efficiency", Nature Photonics, vol. 3, pp. 649-653, (2009).

Calnan, S. et al., "High mobility transparent conducting oxides for thin film solar cells", Thin Solid Films, vol. 518, pp. 1839-1849, (2010).

Aduda, B.O. et al., "Effect of morphology on electron drift mobility in porous $TiO_2$", International Journal of Photoenergy, vol. 6, pp. 141-147, (2004).

Richter, C. et al., "Exciton-like trap states limit electron mobility in $TiO_2$ nanotubes", Nature Nanotechnology, vol. 5, pp. 769-772, (2010).

Ruhle, S. et al., "Investigation of the electric field in $TiO_2$/FTO junctions used in dye-sensitized solar cells by photocurrent transients", Journal of Physical Chemistry B, vol. 109, pp. 9522-9526, (2005).

Zhong, Y.L. et al., "Diamond-based molecular platform for photoelectrochemistry", Journal of the American Chemical Society, vol. 130, pp. 17218-17219, (2008).

Benda, V. et al., "Power semiconductor devices: Theory and Applications", John Wiley & Sons Ltd., Chapter 2, section 2.4, pp. 62-65, (1999).

Helander, M.G. et al., "Band alignment at metal/organic and metal/oxide/organic interfaces", Applied Physics Letters, vol. 93, pp. 193310-1-193310-3, (2008).

George, S.M., "Atomic layer deposition: An overview", Chemical Review, vol. 110, pp. 111-131, (2010).

Breen, T.L. et al., "Patterning indium tin oxide and indium zinc oxide using microcontact printing and wet etching", Langmuir, vol. 18, pp. 194-197, (2002).

Emons, T.T. et al., "Synthesis and characterization of mesoporous indium tin oxide possessing an electronically conductive framework", Journal of the American Chemical Society, vol. 124, pp. 8516-8517, (2002).

Mahajeri, M. et al., "Evaluation of the film formation and the charge transport mechanism of indium tin oxide nanoparticle films", Thin Solid Films, vol. 518, pp. 3373-3381, (2010).

Lee, I. et al., "Growth of conductive indium tin oxide (ITO) nanoparticles by mineralization in ring-shaped biomimetic templates", Journal of Physical Chemistry C, vol. 113, pp. 17372-17377, (2009).

Purwanto, A. et al., "Facile method for the fabrication of vertically aligned ITO nanopillars with excellent properties", Chemistry of Materials Communication, vol. 21, pp. 4087-4089, (2009).

Choi, S-I. et al., "Preparation and optical properties of colloidal, monodisperse, and highly crystalline ITO nanoparticles", Chemistry of Materials, vol. 20, pp. 2609-2611, (2008).

Aouaj, M.A. et al., "Comparative study of ITO and FTO thin films grown by spray pyrolysis", Materials Research Bulletin, vol. 44, pp. 1458-1461, (2009).

Epifani, M. et al., "Solution synthesis of thin films in the $SnO_2$-$In_2O_3$ system: A case study of the mixing of sol-gel and metal-organic solution processes", Chemistry of Materials, vol. 18, pp. 840-846, (2006).

Cho, Y-S. et al., "Colloidal indium tin oxide nanoparticles for transparent and conductive films", Thin Solid Films, vol. 515, pp. 1864-1871, (2006).

Hwang, I. et al., "Drift-diffusion modeling of photocurrent transients in bulk heterojunction solar cells", Journal of Applied Physics, vol. 106, pp. 094506-1-094506-10, (2009).

Chen, P. et al., "High open-circuit voltage solid-state dye-sensitized solar cells with organic dye", Nano Letters, vol. 9, No. 6, pp. 2487-2492, (2009).

Pandey, S.S. et al., "Influence of nature of surface dipoles on observed photovoltage in dye-sensitized solar cells as probed by surface potential measurement", Organic Electronics, vol. 11, pp. 419-426, (2010).

Hamann, T.W. et al., "Outer-sphere redox couples as shuttles in dye-sensitized solar cells. Performance enhancement based on photoelectrode modification via atomic layer deposition" Journal of Physical Chemistry C, vol. 112, pp. 19756-19764, (2008).

Kuciauskas, D. et al., "Electron transfer dynamics in nanocrystalline titanium dioxide solar cells sensitized with ruthenium or osmium polypyridyl complexes", Journal of Physical Chemistry B, vol. 105, pp. 392-403, (2001).

(56) References Cited

OTHER PUBLICATIONS

Fabregat-Santiago, F. et al., "Electron transport and recombination in solid-state dye solar cell with spiro-OMeTAD as hole conductor", Journal of the American Chemical Society, vol. 131, pp. 558-562, (2009).

Ding, I-K. et al., "Pore-filling of spiro-OMeTAD in solid-state dye sensitized solar cells: Quantification, mechanism, and consequences for device performance", Advanced Functional Materials, vol. 19, pp. 2431-2436, (2009).

Li, T.C. et al., "Ni(III)/(IV) Bis(dicarbollide) as a fast, noncorrosive redox shuttle for dye-sensitized solar cells", Journal of the American Chemical Society, vol. 132, pp. 4580-4582, (2010).

Wang, M. et al., "An organic redox electrolyte to rival triiodide/iodide in dye-sensitized solar cells", Nature Chemistry, vol. 2, pp. 385-389, (2010).

Usami, A. et al., "Theoretical study of application of multiple scattering of light to a dye-sensitized nanocrystalline photoelectrochemical cell", Chemical Physics Letters, vol. 277, pp. 105-108, (1997).

Nishimura, S. et al., "Standing wave enhancement of red absorbance and photocurrent in dye-sensitized titanium dioxide photoelectrodes coupled to photonic crystals", Journal of the American Chemical Society, vol. 125, pp. 6306-6310, (2003).

Mihi, A. et al., "Origin of light-harvesting enhancement in colloidal-photonic-crystal-based dye-sensitized solar cells", Journal of Physical Chemistry B, vol. 109, pp. 15968-15976, (2005).

Mihi, A. et al., "Full spectrum enhancement of the light harvesting efficiency of dye sensitized solar cells by including colloidal photonic crystal multilayers", Applied Physics Letters, vol. 88, pp. 193110-1-193110-3, (2006).

Mihi, A. et al., "Spectral response of opal-based dye-sensitized solar cells", Journal of Physical Chemistry C, vol. 112, pp. 13-17, (2008).

Waterhouse, G.I.N. et al., "Physical and optical properties of inverse opal $CeO_2$ photonic crystals", Chemistry of Materials, vol. 20, pp. 1183-1190, (2008).

Turner, M.E. et al., "Thin films of macroporous metal oxides", Advanced Materials, vol. 13, pp. 180-183, (2001).

Jiang, P. et al., "A lost-wax approach to monodisperse colloids and their crystals", Science, vol. 291, pp. 453-457, (2001).

Jiang, P. et al., "The fabrication and bandgap engineering of photonic multilayers", Advanced Materials, vol. 13, pp. 389-393, (2001).

Rengurajan, R. et al., "Colloidal photonic superlattices", Physical Review B, vol. 64, pp. 205103-1-205103-4, (2001).

Holland, B.T. et al., "Synthesis of macroporous minerals with highly ordered three-dimensional arrays of spheroidal voids", Science, vol. 281, pp. 538-540, (1998).

Yan, H. et al., "General synthesis of periodic macroporous solids by templated salt precipitation and chemical conversion", Chemistry of Materials, vol. 12, pp. 1134-1141, (2000).

Schroden, R.C. et al., "Self-modification of spontaneous emission by inverse opal silica photonic crystals", Chemistry of Materials, vol. 13, pp. 2945-2950, (2001).

Yablonovitch, E., "Inhibited spontaneous emission in solid-state physics and electronics", Physical Review Letters, vol. 58, No. 20, pp. 2059-2062, (1987).

John, S., "Strong localization of photons in certain disordered dielectric superlattices", Physical Review Letters, vol. 58, pp. 2486-2489, (1987).

Han, C-H. et al., "Synthesis of indium tin oxide (ITO) and fluorine-doped tin oxide (FTO) nano-powder by sol-gel combustion hybrid method", Materials Letters, vol. 61, pp. 1701-1703, (2007).

Ito, S. et al., "Control of dark current in photoelectrochemical ($TiO_2/I^-I_3^-$) and dye-sensitized solar cells", Chemical Communications, pp. 4351-4353, (2005).

Hatton, B. et al., "Assembly of large-area, highly ordered, crack-free inverse opal films", Proceeding of the National Academy of Science, vol. 107, pp. 10354-10359, (2010).

Tao, C. et al., "Theoretical demonstration of efficiency enhancement of dye-sensitized solar cells with double-inverse opal as mirrors", Journal of Physical Chemistry C, vol. 114, pp. 10641-10647, (2010).

Izumi, Y. et al., "Improving the light out-coupling properties of inorganic thin-film electroluminescent devices", Japanese Journal of Applied Physics, vol. 41, part 1, No. 3A, pp. 1284-1287, (2002).

Christ, A. et al., "Waveguide-plasmon polaritons: Strong coupling of photonic and electronic resonances in a metallic photonic crystal slab", Physical Review Letters, vol. 91, No. 18, pp. 183901-1-183901-4, (2003).

Lee, J. et al., "Electrostatic capacitance of $TiO_2$ nanowires in a porous alumina template", Nanotechnology, vol. 16, pp. 1449-1453, (2005).

Park, Y.R. et al., "Structural and optical properties of rutile and anatase $TiO_2$ thin films: Effects of Co doping", Thin Solid Films, vol. 484, pp. 34-38, (2005).

Stamate, M. et al., "Anatase—rutil $TiO_2$ thin films deposited in a D.C. magnetron sputtering system", Romanian Journal of Physics, vol. 53, No. 1-2, pp. 217-221, (2008).

Tennakone, K. et al., "The possibility of ballistic electron transport in dye-sensitized semiconductor nanocrystalline particle aggregates", Semiconductor Science and Technology, vol. 14, pp. 975-978, (1999).

Niinobe, D. et al., "Origin of enhancement in open-circuit voltage by adding ZnO to nanocrystalline $SnO_2$ in dye-sensitized solar cells", Journal of Physical Chemistry B, vol. 109, pp. 17892-17900, (2005).

Kay, A. et al., "Dye-sensitized core-shell nanocrystals: Improved efficiency of mesoporous tin oxide electrodes coated with a thin layer of an insulating oxide", Chemistry of Materials, vol. 14, pp. 2930-2935, (2002).

Benko, G. et al., "Interligand electron transfer determines triplet excited state electron injection in RuN3-sensitized $TiO_2$ films", Journal of Physical Chemistry B, vol. 108, pp. 2862-2867, (2004).

Kallioinen, J. et al., "Electron transfer from the singlet and triplet excited states of $Ru(dcbpy)_2(NCS)_2$ into nanocrystalline $TiO_2$ thin films", Journal of Physical Chemistry B, vol. 106, pp. 4396-4404, (2002).

Asbury, J.B. et al., "Femtosecond IR study of excited-state relaxation and electron-injection dynamics of $Ru(dcbpy)_2(NCS)_2$ in solution and on nanocrystalline $TiO_2$ and $Al_2O_3$ thin films", Journal of Physical Chemistry B, vol. 103, pp. 3110-3119, (1999).

Datta, S. "Electronic Transport in Mesoscopic Systems" Cambridge Studies in Semiconductor Physics and Microelectronic Engineering, Cambridge University Press: New York, Chapter 2, pp. 57-111, (1997).

Anderson, K. et al., "Reactivity of titanium hydride with air", Industrial and Engineering Chemistry, vol. 42, No. 7, pp. 1381-1383, (1950).

Kathawalla, I.A. et al., "Pore size effects on diffusion of polystyrene in dilute solution", Industrial and Engineering Chemistry Research, vol. 27, pp. 866-871, (1988).

Hartmann, P. et al., "Mesoporous $TiO_2$: Comparison of classical sol-gel and nanoparticle based photoelectrodes for the water splitting reaction", ACS Nano, vol. 4, No. 6, pp. 3147-3154, (2010).

Liu, X. et al., "Highly crystalline spindle-shaped mesoporous anatase titania particles: Solution-phase synthesis, characterization, and photocatalytic properties", Langmuir, vol. 26, pp. 7671-7674, (2010).

Atwater, H.A. et al., "Plasmonics for improved photovoltaic devices", Nature Materials, vol. 9, pp. 205-213, (2010).

Prodan, E. et al., "A hybridization model for the plasmon response of complex nanostructures", Science, vol. 302, pp. 419-422, (2003).

Ferry, V.E. et al., "Design considerations for plasmonic photovoltaics", Advanced Materials, vol. 22, pp. 4794-4808, (2010).

Testino, A. et al., "Optimizing the photocatalytic properties of hydrothermal $TiO_2$ by the control of phase composition and particle morphology. A systematic approach", Journal of the American Chemical Society, vol. 129, pp. 3564-3575, (2007).

Usseglio, S. et al., "$(I_2)_n$ Encapsulation inside $TiO_2$: A way to tune photoactivity in the visible region", Journal of the American Chemical Society, vol. 129, pp. 2822-2828, (2007).

Gur, I. et al., "Air-stable all-inorganic nanocrystal solar cells processed from solution", Science, vol. 310, pp. 462-465, (2005).

Kongkanand, A. et al., "Quantum dot solar cells. Tuning photoresponse through size and shape control of CdSe-TiO architecture", Journal of the American Chemical Society, vol. 130, pp. 4007-4015, (2008).

(56) References Cited

OTHER PUBLICATIONS

Huynh, W.U. et al., "Hybrid nanorod-polymer solar cells", Science, vol. 295, pp. 2425-2427, (2002).
Hains, A.W. et al., "Molecular semiconductors in organic photovoltaic cells", Chemical Review, vol. 110, pp. 6689-6735, (2010).
Zhu, X-Y. et al., "Charge-transfer excitons at organic semiconductor surfaces and interfaces", Accounts of Chemical Research, vol. 42, pp. 1779-1787, (2009).
Bredas, J.L. et al., "Molecular understanding of organic solar cells: The challenges", Accounts of Chemical Research, vol. 42, pp. 1691-1699, (2009).
Gunes, S. et al., "Conjugated polymer-based organic solar cells", Chemical Reviews, vol. 107, pp. 1324-1338, (2007).
Fischer, S. et al., "Enhancement of silicon solar cell efficiency by upconversion: Optical and electrical characterization", Journal of Applied Physics, vol. 108, pp. 044912-1-044912-11, (2010).
Sokolnicki, J. et al., "Investigation of Er, Er:Yb and Er:Tm systems in silica sol-gels", Journal of Alloys and Compounds, vol. 300-301, pp. 450-455, (2000).
Delevaque, E. et al., "Modeling of pair-induced quenching in erbium-doped silicate fibers", IEEE Photonics Technology Letters, vol. 5, pp. 73-75, (1993).
Boivin, D. et al., "Quenching investigation on new erbium doped fibers using MCVD nanoparticle doping process", Proceedings of SPIE, vol. 7580, pp. 75802B-1-75802B-9, (2010).
Solomon, S.D. et al., "Synthesis and study of silver nanoparticles", Journal of Chemical Education, vol. 84, No. 2, pp. 322-325, (2007).
Smestad, G.P. et al., "Demonstrating electron transfer and nanotechnology: A natural dye-sensitized nanocrystalline energy converter", Journal of Chemical Education, vol. 75, pp. 752-756, (1998).
Zeng, X.Q. et al., "Hydrogen gas sensing with networks of ultrasmall palladium nanowires formed on filtration membranes", Nano Letters, vol. 11, pp. 262-268, (2011).
Cameron, P.J. et al., "How does back-reaction at the conducting glass substrate influence the dynamic photovoltage response of nanocrystalline dye-sensitized solar cells?", Journal of Physical Chemistry B, vol. 109, pp. 7392-7398, (2005).
O'Regan, B.C. et al., "Influence of the $TiCl_4$ treatment on nanocrystalline $TiO_2$ films in dye-sensitized solar cells. 2. Charge density, band edge shifts, and quantification of recombination losses at short circuit", Journal of Physical Chemistry C, vol. 111, pp. 14001-14010, (2007).
Yu, H. et al., "High-performance $TiO_2$ photoanode with an efficient electron transport network for dye-sensitized solar cells", Journal of Physical Chemistry C, vol. 113, pp. 16277-16282, (2009).
Kang, S.H. et al., "Nanorod-based dye-sensitized solar cells with improved charge collection efficiency", Advanced Materials, vol. 20, pp. 54-58, (2008).
Kuang, D. et al., "Application of highly ordered $TiO_2$ nanotube arrays in flexible dye-sensitized solar cells", ACS Nano, vol. 2, No. 6, pp. 1113-1116, (2008).
Wang, Y, et al., "Ordered mesoporous Sb-, Nb-, and Ta- doped $SnO_2$ thin films with adjustable doping levels and high electrical conductivity", ACS Nano, vol. 3, No. 6, pp. 1373-1378, (2009).
Wu, H. et al., "Low reflectivity and high flexibility of tin-doped indium oxide nanofiber transparent electrodes", Journal of the American Chemical Society, vol. 133, pp. 27-29, (2011).
Fessenden, R.W. et al., "Rate constants for charge injection from excited sensitizer into $SnO_2$, ZnO, and $TiO_2$ semiconductor nanocrystallites", Journal of Physical Chemistry, vol. 99, pp. 12902-12906, (1995).
Guldin, S. et al., "Dye-sensitized solar cell based on a three-dimensional photonic crystal" Nano Letters, vol. 10, pp. 2303-2309, (2010).
Jacobsen V. et al., "Electronic properties of nanoporous $TiO_2$ films investigated in real space by means of scanning tunneling spectroscopy", Applied Surface Science, vol. 252, pp. 3903-3911, (2006).
Breeze, A.J. et al., "Charge transport in $TiO_2$/MEH-PPV polymer photovoltaics", Physical Review B, vol. 64, pp. 125205-1-125205-9, (2001).
Turrion, M. et al., "Potential distribution and photovoltage origin in nanostructured $TiO_2$ sensitization solar cells: An interference reflection study", Journal of Physical Chemistry B, vol. 105, pp. 9732-9738, (2001).
Turrion, M. et al., "Flatband potential of $F:SnO_2$ in a $TiO_2$ dye-sensitized solar cell: An interference reflection study" Journal of Physical Chemistry B, vol. 107, pp. 9397-9403, (2003).
Kawashima, T. et al., "FTO/ITO double-layered transparent conductive oxide for dye-sensitized solar cells", Journal of Photochemistry and Photobiology A: Chemistry, vol. 164, pp. 199-202, (2004).
Zhi, X. et al., "The morphological, optical and electrical properties of $SnO_2$:F thin films prepared by spray pyrolysis", Surface and Interface Analysis, vol. 40, pp. 67-70, (2008).
Kumar, V. et al., "Optical and photocatalytic properties of heavily $F^-$-doped $SnO_2$ Nanocrystals by a novel single-source precursor approach" Inorganic Chemistry, vol. 50, pp. 5637-5645, (2011).
Abel, K.A. et al., "Analysis of the shell thickness distribution on $NaYF_4/NaGdF_4$ core/shell nanocrystals by EELS and EDS", The Journal of Physical Chemistry Letters, vol. 2, pp. 185-189, (2011).
Ramasamy, E. et al., "Ordered mesoporous $SnO_2$-based photoanodes for high-performance dye-sensitized solar cells", Journal of Physical Chemistry C, vol. 114, pp. 22032-22037, (2010).
Tiwana, P. et al., "Electron mobility and injection dynamics in mesoporous ZnO, $SnO_2$, and $TiO_2$ films used in dye-sensitized solar cells" ACS Nano, vol. 5, No. 6, pp. 5158-5166, (2011).
Chappel, S. et al., "$TiO_2$-coated nanoporous $SnO_2$ electrodes for dye-sensitized solar cells", Langmuir, vol. 18, pp. 3336-3342, (2002).
Prasittichai, C. "Surface modification of $SnO_2$ photoelectrodes in dye-sensitized solar cells: Significant improvements in photovoltage via $Al_2O_3$ atomic layer deposition" The Journal of Physical Chemistry Letters, vol. 1, pp. 1611-1615, (2010).
Klein, A. et al., "Transparent conducting oxides for photovoltaics: Manipulation of Fermi level, work function and energy band alignment", Materials, vol. 3, pp. 4892-4914, (2010).
Avadhut, Y.S. et al., "Study on the defect structure of $SnO_2$:F nanoparticles by high-resolution solid-state NMR" Chemistry of Materials, vol. 23, pp. 1526-1538, (2011).
Gubbala, S. et al., "Band-edge engineered hybrid structures for dye-sensitized solar cells based on $SnO_2$ nanowires", Advanced Functional Materials, vol. 18, pp. 2411-2418, (2008).
Snaith, H.J. et al., "$SnO_2$-based dye-sensitized hybrid solar cells exhibiting near unity absorbed photon-to-electron conversion efficiency", Nano Letters, vol. 10, pp. 1259-1265, (2010).
Sellers, M.C.K. et al., "Manipulation of polycrystalline $TiO_2$ carrier concentration via electrically active native defects", Journal of Vacuum Science and Technology A, vol. 29, No. 6, pp. 061503-1-061503-8, (2011).
Ito, S. et al., "Study of dye-sensitized solar cells by scanning electron micrograph observation and thickness optimization of porous $TiO_2$ electrodes" International Journal of Photoenergy, vol. 2009, pp. 1-8, (2009).
Ito, S. et al., "High-efficiency organic-dye-sensitized solar cells controlled by nanocrystalline-$TiO_2$ electrode thickness", Advanced Materials, vol. 18, pp. 1202-1205, (2006).
Gonzalez-Pedro, V. et al., "Modeling high-efficiency quantum dot sensitized solar cells", ACS Nano, vol. 4, No. 10, pp. 5783-5790, (2010).
Wang, Q. et al., "Characteristics of high efficiency dye-sensitized solar cells", Journal of Physical Chemistry B, vol. 110, pp. 25210-25221, (2006).
Fabregat-Santiago, F. et al., "Characterization of nanostructured hybrid and organic solar cells by impedance spectroscopy", Physical Chemistry Chemical Physics, vol. 13, pp. 9083-9118, (2011).
Agrios, A.G. et al., "Low-temperature $TiO_2$ films for dye-sensitized solar cells: Factors affecting energy conversion efficiency", Journal of Physical Chemistry C, vol. 112, pp. 10021-10026, (2008).

(56) References Cited

OTHER PUBLICATIONS

Spokoyny, A.M. et al., "Electronic tuning of nickel-based bis(dicarbollide) redox shuttles in dye-sensitized solar cells", Angewandte Chemie International Edition, vol. 49, pp. 5339-5343, (2010).

Wang, Q. et al., "Constructing ordered sensitized heterojunctions: Bottom-up electrochemical synthesis of p-type semiconductors in oriented n-$TiO_2$ nanotube arrays", Nano Letters, vol. 9, No. 2, pp. 806-813, (2009).

Zhang, Y. et al., "Three-dimensional nanostructures as highly efficient generators of second harmonic light", Nano Letters, vol. 11, pp. 5519-5523, (2011).

Liu, L. et al., "$TiO_2$ inverse-opal electrode fabricated by atomic layer deposition for dye-sensitized solar cell applications", Energy & Environmental Science, vol. 4, pp. 209-215, (2011).

Lee, S-H. A. et al., "Coupling of titania inverse opals to nanocrystalline titania layers in dye-sensitized solar cells", Journal of Physical Chemistry B, vol. 112, No. 46, pp. 14415-14421, (2008).

Wang, M. et al., "The influence of charge transport and recombination on the performance of dye-sensitized solar cells", Chem Phys Chem, vol. 10, pp. 290-299, (2009).

Ginley, D.S. et al., "Transparent conducting oxides", Materials Research Society Bulletin, vol. 25, issue 8, pp. 15-18, (2000).

Lewis, B.G. et al., "Applications and processing of transparent conducting oxides", Materials Research Society Bulletin, vol. 25, issue 8, pp. 22-27, (2000).

Haacke, G., "Transparent conducting coatings", Annual Review of Materials Science, vol. 7, pp. 73-93, (1977).

Granqvist, C.G., "Transparent conductors as solar energy materials: A panoramic review", Solar Energy Materials and Solar Cells, vol. 91, pp. 1529-1598, (2007).

Edwards, P.P. et al., "Basic materials physics of transparent conducting oxides", Dalton Transactions, pp. 2995-3002, (2004).

Hoel, C.A. et al., "Transparent conducting oxides in the $ZnO$-$In_2O_3$-$SnO_2$ system", Chemistry of Materials, vol. 22, pp. 3569-3579, (2010).

Rauf, I.A., "Low resistivity and high mobility tin-doped indium oxide films", Materials Letters, vol. 18, pp. 123-127, (1993).

Armstrong, N.R. et al., "Oxide contacts in organic photovoltaics: Characterization and control of near-surface composition in indium-tin oxide (ITO) electrodes", Accounts of Chemical Research, vol. 42, No. 11, pp. 1748-1757, (2009).

Walzer, K. et al., "Highly efficient organic devices based on electrically doped transport layers", vol. 107, pp. 1233-1271, (2007).

Ruhle, S. et al., "Electron tunneling at the $TiO_2$/substrate interface can determine dye-sensitized solar cell performance", Journal of Physical Chemistry B, vol. 108, pp. 17946-17951, (2004).

Jin, W-M. et al., "Holographically defined $TiO_2$ Electrodes for dye-sensitized solar cells", Applied Materials and Interfaces, vol. 2, No. 11, pp. 2970-2973, (2010).

Taranekar, P. et al., "Hyperbranched conjugated polyelectrolyte bilayers for solar-cell applications", Journal of the American Chemical Society, vol. 129, pp. 8958-8959, (2007).

Li, Y. et al., "Efficient fabrication and enhanced photocatalytic activities of 3D-ordered films of titania hollow spheres", Journal of Physical Chemistry B, vol. 110, pp. 13000-13004, (2006).

Xie, H. et al., "Facile fabrication of 3D-ordered macroporous nanocrystalline iron oxide films with highly efficient visible light induced photocatalytic activity", Journal of Physical Chemistry C, vol. 114, pp. 9706-9712, (2010).

Fujihara, S. et al., "Hydrothermal routes to prepare nanocrystalline mesoporous $SnO_2$ having high thermal stability", Langmuir, vol. 20, pp. 6476-6481, (2004).

Martinez, A.I. et al., "Physicochemical characteristics of fluorine doped tin oxide films", Journal of Physics D: Applied Physics, vol. 39, pp. 5091-5096, (2006).

Ramaiah, K.S. et al., Structural and electrical properties of fluorine doped tin oxide films prepared by spray-pyrolysis technique, Applied Surface Science, vol. 253, pp. 1451-1458, (2006).

Smith, A. et al., "Relation between solution chemistry and morphology of $SnO_2$-based thin films deposited by a pyrosol process", Thin Solid Films, vol. 266, pp. 20-30, (1995).

Li, H. et al., "Antireflective photoanode made of $TiO_2$ nanobelts and a ZnO nanowire array", Journal of Physical Chemistry C, vol. 114, pp. 11375-11380, (2010).

Jeong, J-A. et al., "Thickness effect of RF sputtered $TiO_2$ passivating layer on the performance of dye-sensitized solar cells", Solar Energy Materials and Solar Cells, vol. 95, pp. 344-348, (2011).

Moyo, M. et al., "Recent advances in polymeric materials used as electron mediators and immobilizing matrices in developing enzyme electrodes", Sensors, vol. 12, pp. 923-953, (2012).

Hamberg, I. et al., "Evaporated Sn-doped $In_2O_3$ films: Basic optical properties and applications to energy-efficient windows", Journal of Applied Physics, vol. 60, issue 11, pp. R123-R159, (1986).

"Polyox Water-Soluble Resins", The Dow Chemical Company, pp. 1-23, (2002).

Takagi, D. et al., "Mechanism of gold-catalyzed carbon material growth", Nano Letters, vol. 8, No. 3, pp. 832-835, (2008).

Jiang, Q. et al., "Low voltage-driven solid electrochromic devices based on 3-D nanoporous FTO electrodes", Abstracts of Papers of the American Chemical Society, vol. 246, (2013).

Bar, G. et al., "RGB organic electrochromic cells", Solar Energy Materials & Solar Cells, vol. 99, pp. 123-128, (2012).

Scherer, M.R.J. et al., "Efficient electrochromic devices made from 3D nanotubular gyroid networks", Nano Letters, vol. 13, No. 7, pp. 3005-3010, (2013).

Jain, V. et al., "Millisecond switching in solid state electrochromic polymer devices fabricated from ionic self-assembled multilayers", Applied Physics Letters, vol. 92, No. 3, pp. 033304-1-033304-3, (2008).

Kim, S-H. et al., "Synthesis of a perylenediimide-viologen dyad (PDI-2V) and its electrochromism in a layer-by-layer self-adembled multilayer film with PEDOT:PSS", Journal of Materials Chemistry, vol. 22, pp. 13558-13563, (2012).

Beaujuge, P.M. et al., "Color control in π-conjugated organic polymers for use in electrochromic devices", Chemical Reviews, vol. 110, No. 1, pp. 268-320, (2010).

Gunbas, G. et al., "Electrochromic conjugated polyheterocycles and derivatives-highlights from the last decade towards realization of long lived aspirations", Chemical Communications, vol. 48, pp. 1083-1101, (2012).

Choi, S.Y., et al., "Electrochromic performance of viologen-modified periodic mesoporous nanocrystalline anatase electrodes", Nano Letters, vol. 4, No. 7, pp. 1231-1235, (2004).

Jain, V. et al., "High-contrast solid-state electrochromic devices of viologen-bridged polysilsesquioxane nanoparticles fabricated by layer-by-layer assembly", Applied Materials & Interfaces, vol. 1, No. 1, pp. 83-89, (2009).

Brewster, T.P. et al., "Hydroxamatte anchors for improved photoconversion in dye-sensitized solar cells", Inorganic Chemistry, vol. 52, pp. 6752-6764, (2013).

Abraham, K.M. et al., "Highly conductive PEO-like polymer electrolytes", Chemistry of Materials, vol. 9, No. 9, pp. 1978-1988, (1997).

Li, J. et al., "Effects of vinyl ethylene carbonate additive on elevated-temperature performance of cathode material in lithium ion batteries", Journal of Physical Chemistry C, vol. 112, No. 32, pp. 12550-12556, (2008).

Byker, H.J. "Electrochromics and polymers", Electrochimica Acta, vol. 46, pp. 2015-2022, (2001).

Liu, F-Q. et al., "Three-dimensional conducting oxide nanoarchitectures: morphology-controllable synthesis, characterization, and application in lithium-ion batteries", Nanoscale, vol. 5, pp. 6422-6429, (2013).

Cho, S.I. et al., "Nanotube-based ultrafast electrochromic display", Advanced Materials, vol. 17, No. 2, pp. pp. 171-175, (2005).

Freitag, M. et al., "Cucurbituril complexes of viologens bound to $TiO_2$ Films", Langmuir, vol. 26, No. 11, pp. 8262-8269, (2010).

Moller, M. et al., "Switchable electrochromic images based on a combined top-down bottom-up approach", Advanced Materials, vol. 16, No. 17, pp. 1558-1561, (2004).

(56) References Cited

OTHER PUBLICATIONS

Wu, H. et al., "Low reflectivity and high flexibility of tin-doped indium oxide nanofiber transparent eletrodes", Journal of the American Chemical Society, vol. 133, No. 1, pp. 27-29, (2011).

Li, Z. et al., "Electrochemistry of metalloporphyrins and viologens at zeolite Y modified electrodes: Evidence for electron trapping by monomolecular porphyrin layers", Journal of Physical Chemistry, vol. 92, No. 9, pp. 2592-2597, (1988).

Yang, X. et al., "A self-powered electrochromic device driven by a nanogenerator", Energy & Environmental Science, vol. 5, pp. 9462-9466, (2012).

Saito, Y. et al., "Investigation of the conduction mechanisms of lithium gel polymer electrolytes based on electrical conductivity and diffusion coefficient using NMR", Macromolecules, vol. 34, pp. 6955-6958, (2001).

X. Tu, et al. "The synthesis and electrochemical properties of cathodic-anodic composite electrochromic materials" Dyes and Pigments, vol. 88, pp. 39-43, (2011).

Hünig, S. et al., "Violene/cyanine hybrids: A general structure for electrochromic systems", Chemistry—A European Journal, vol. 5, issue 7, pp. 1969-1973, (1999).

Kurth, D.G. et al., "A new Co(II)-metalloviologen-based electrochromic material integrated in thin multilayer films", Chemical Communications, issue 16, pp. 2119-2121, (2005).

Pichot, F. et al., "A series of multicolor electrochromic ruthenium(II) trisbipyridine complexes: Synthesis and electrochemistry", Journal of Physical Chemistry A, vol. 103, No. 31, pp. 6263-6267, (1999).

Reeves, B.D. et al., "Spray coatable electrochromic dioxythiophene polymers with high coloration efficiencies", Macromolecules, vol. 37, No. 20, pp. 7559-7569, (2004).

Sonmez, G. et al., "Red, green, and blue colors in polymeric electrochromics", Advanced Materials, vol. 16, No. 21, pp. 1905-1908, (2004).

Bernhard, S. et al., "Iron(II) and copper(I) coordination polymers: Electrochromic materials with and without chiroptical properties", Inorganic Chemistry, vol. 42, No. 14, pp. 4389-4393, (2003).

Seki, S. et al., "Effect of binder polymer structures used in composite cathodes on interfacial charge transfer processes in lithium polymer batteries", Electrochimica Acta, vol. 50, issues 2-3, pp. 379-383, (2004).

Li, W. et al., "A novel polymer quaternary ammonium iodide and application in quasi-solid-state dye-sensitized solar cells" Journal of Photochemistry and Photobiology A: Chemistry, vol. 170, issue 1, pp. 1-6, (2005).

Kang, J. et al., "Polymer electrolytes from PEO and novel quaternary ammonium iodides for dye-sensitized solar cells", Electrochimica Acta, vol. 48, issue 17, pp. 2487-2491, (2003).

Wang, G. et al., "Gel polymer electrolytes based on polyacrylonitrile and a novel quaternary ammonium salt for dye-sensitized solar cells", Materials Research Bulletin, vol. 39, issue 13, pp. 2113-2118, (2004).

Sun, X-G. et al., "Comb-shaped single ion conductors based on polyacrylate ethers and lithium alkyl sulfonate", Electrochimica Acta, vol. 50, issue 5, pp. 1139-1147, (2005).

Ohno, H. et al., "Development of new class of ion conductive polymers based on ionic liquids", Electrochimica Acta, vol. 50, issues 2-3, pp. 255-261, (2004).

Morita, M. et al., "Ionic conductance behavior of polymeric gel electrolyte containing ionic liquid mixed with magnesium salt", Journal of Power Sources, vol. 139, issues 1-2, pp. 351-355, (2005).

Grätzel, M. "Materials science: Ultrafast colour displays", Nature, vol. 409, pp. 575-576, (2001).

Definition of "Electronic visual display", printed from Wikipedia, the free encyclopedia on Oct. 20, 2014, 6 pages, found at http://en.wikipedia.org/wiki/Electronic_visual_display.

Jheong, H.K. et al., "Electrochromic property of the viologen-anchored mesoporous $TiO_2$ films", Journal of Electroceramics, vol. 17, issue 2-4, pp. 929-932, (2006).

Tebby, Z. et al., "Low-temperature UV-processing of nanocrystalline nanoporous thin $TiO_2$ films: An original route toward plastic electrochromic systems", Chemistry of Materials, vol. 20, No. 23, pp. 7260-7267, (2008).

Arsenault, E. et al., "Periodic macroporous nanocrystalline antimony-doped tin oxide electrode", ACS Nano, vol. 5, No. 4, pp. 2984-2988, (2011).

Liu, F-Q. et al., "Three-dimensional conducting oxide nanoarchitectures: morphology-controllable synthesis, characterization, and applications in lithium-ion batteries", Nanoscale, Supporting Information, pp. S1-S16, (2013).

Jiang, Q. et al., "Fast and low voltage-driven solid-state electrochromics using 3-D conductive FTO nanobead electrodes", Journal of Material Chemistry C, vol. 2, pp. 618-621, (2014).

Ryu, J-H. et al., "Preparation of a multicolored reflective electrochromic display based on monodisperse polymeric microspheres with N-substituted viologen pendants", Journal of Applied Polymer Science, vol. 107, issue 1, pp. 102-108, (2008).

Steuerman, D.W. et al., "Molecular-mechanical switch-based solid-state electrochromic devices", Angewandte, Chemie International Edition, vol. 43, pp. 6486-6491, (2004).

Sotzing, G.A. et al., "Multiply colored electrochromic carbazole-based polymers", Chemistry of Materials, vol. 9, No. 7, pp. 1578-1587, (1997).

Berridge, R. et al., "Electrochromic properties of a fast switching, dual colour polythiophene bearing non-planar dithiinoquinoxaline units", Journal of Materials Chemistry, vol. 17, issue 3, No. 225-231, (2007).

Durmus, A. et al., "A neutral state green polymer with a superior transmissive light blue oxidized state", Chemical Communications, issue 31, pp. 3246-3248, (2007).

Sonmez, G. et al., "A red, green, and blue (RGB) polymeric electrochromic device (PECD): The dawning of the PECD era", Angewandte Chemie, vol. 116, issue 12, pp. 1524-1528, (2004).

Thompson, B.C. et al., "In situ colorimetric analysis of electrochromic polymers and devices", Chemistry of Materials, vol. 12, No. 6, pp. 1563-1571, (2000).

Schottland, P. et al., "Poly(3,4-alkylenedioxypyrrole)s: Highly stable electronically conducting and electrochromic polymers", Macromolecules, vol. 33, No. 19, pp. 7051-7061, (2000).

Li, X-G. et al., "Synthesis, film-forming, and electronic properties of o-Phenylenediamine copolymers displaying an uncommon tricolor", Macromolecules, vol. 40, No. 5, pp. 1489-1496, (2007).

Beaupré, S. et al., "Toward the development of new textile/plastic electrochromic cells using triphenylamine-based copolymers", Chemistry of Materials, vol. 18, No. 17, pp. 4011-4018, (2006).

Fungo, F. et al., "Plastic electrochromic devices: Electrochemical characterization and device properties of a phenothiazine-phenylquinoline donor-acceptor polymer", Chemistry of Materials, vol. 15, No. 6, pp. 1264-1272, (2003).

Cummins, D. et al., "Ultrafast electrochromic windows based on redox-chromophore modified nanostructructured semiconducting and conducting films", The Journal of Physical Chemistry B, vol. 104, No. 48, pp. 11449-11459, (2000).

* cited by examiner

HIGHLY EFFICIENT DYE-SENSITIZED SOLAR CELLS USING MICROTEXTURED ELECTRON COLLECTING ANODE AND NANOPOROUS AND INTERDIGITATED HOLE COLLECTING CATHODE AND METHOD FOR MAKING SAME

BACKGROUND OF THE INVENTION

1. Field of the Invention

The present invention generally relates to the field of photovoltaic devices. Specifically, the present invention relates to the areas of dye sensitized solar cells (DSSCs).

2. Description of Related Art

As global climate change becomes an issue of increasing concern, cutting greenhouse gas emissions from energy production has become top priority. Solar energy is currently thought to hold immense potential as a reliable clean energy source. Effective utilization of solar energy relies on the development of efficient photovoltaic devices including dye sensitized solar cells (DSSCs).

Nanocrystalline dye-sensitized solar cells (DSSC) are appealing devices for solar-electric energy conversion because of their potentially low cost, and simple process in comparison to silicon-based photovoltaics. In a classic DSSC device configuration, the incident solar light first penetrates the device through a piece of transparent conducting oxide (TCO) glass, on which a thick layer of interconnected semiconducting nanoparticles (NP) such as $TiO_2$ are coated to provide a large internal surface area for anchoring the light-harvesting dye molecules, whose lowest unoccupied molecular orbital matches the conduction band edge of the nanoparticles. The dye molecules are excited by the incident photons, leading to electron-hole pairs (excitons), of which the electrons are quickly injected into the conduction band of the semiconducting nanoparticles and subsequently collected by the TCO anode, while the holes in the highest unoccupied molecular orbital are refilled by electrons from the cathode via redox species, e.g. an $I-/I3-$ couple in an electrolyte that interpenetrates the nanoparticle network.

The trap-limited electron transport in the nanoparticle network often leads to low electron-collection efficiency, thereby leading to low energy conversion efficiency, inherently due to the defect states at the particle-particle interface or in the bulk of the nanoparticles, where the congested electrons are recombined with the oxidized dye molecules or redox species such as $I3-$. On the other hand, the photocurrent is also influenced by the diffusion of the $I-/I3-$ couple in electrolyte.

The overall efficiency ($\eta$) of a solar cell is calculated from $\eta=(FF \times |Jsc| \times Voc)/I$, where Jsc is the short circuit photocurrent density, Voc is the open-circuit photovoltage, FF is the fill factor of the cell and I is the light intensity ($I=0.1$ W/cm2 for one sun at AM 1.5 G). In addition to maximizing the overlap of the absorption window of dyes and the solar spectrum through the discovery of new dyes, Jsc can also be improved by thickening the $TiO_2$ nanoparticle film for increased optical density. However, a dilemma arises in that the electron diffusion length, typically 10 μm in $TiO_2$ nanoparticle networks, limits the useful $TiO_2$ nanoparticle film thickness.

Many efforts are focused on improving the electron diffusion length by using nanostructured anodes with a higher degree of order than the random fractal-like assembly of nanoparticles. Those semiconducting nanostructures include nonporous channels, nanotubes, or even single-crystalline nanowires that are all aligned in parallel to each other and vertically with respect to the TCO glass.

For example, enhanced electron transfers have been reported in various n-type semiconducting layers consisting of arrays of one-dimensional (1-D) nanostructures including ZnO nanowires and nanotubes, $TiO_2$ nanotubes, etc. These highly ordered 1-D semiconducting nanostructures provide an ordered pathway for electrons percolating to the collecting anode, in contrast to the highly disordered electron pathway found in a nanoparticulate layer that can lead to significant scattering of free electrons at the particle-particle interfaces. In addition, if the radius of the 1-D n-type semiconductors is large enough, an upward band bending at the semiconductor surface can form, which suppresses the adverse back electron transfers from the semiconductor to the electrolyte or to the oxidized dyes. This is because the Fermi level of an n-type semiconductor is typically higher than the redox potential of the electrolyte. To equilibrate the two electron levels, electrons flow from the semiconductor into the electrolyte. As a result, there is a built-in circular electric field from the surface of the semiconductor nanowires towards their centers. This internal electric field pulls the injected electrons towards the center of the wire and reduces the interception of the electrons by the electrolyte around the surface of the wire. The suppression of back electron transfer improves the current density of the cells.

However, so far, none of these ordered 1-D semiconductor-based DSSCs have achieved an efficiency exceeding that of conventional $TiO_2$ nanoparticle-based DSSCs. This is because many other device parameters are often interlinked, which can offset or reduce the improvements available through the new features. One particular problem is the diametric opposing effect resulting from increasing the length of the ZnO nanowires. On one hand, longer wires exhibit higher short circuit current (Jsc) due to the increased surface area and thus higher dye loading. On the other hand, longer wires lead to higher series resistance, thus lowering the fill factor (FF). Narrower, thus denser nanowires appear as a potential approach to overcome this problem. However, if the Debye-Hückel screening length exceeds the wire radius, reducing the diameter of the wires can eliminate the upward band bending at the wire's surface, an advantage of 1-D semiconductor elucidated above. Typically, depending on the carrier density and the electrolyte, the width of the depletion layer can extend to tens of nanometers into the ZnO wires.

Another fundamental bottleneck that substantially impedes the advantages brought about by 1-D semiconductor photoanode is the slow hole transport that is carried by redox species through mass transport in electrolyte. In all DSSCs that are based on the $I-/I3-$ as redox shuttle, the cathode is essentially a planar platinized TCO that is separated from the semiconductor layer by the electrolyte. Pt is an indispensable catalyst for efficient reduction of $I3-$ to $I-$. The Pt cathode is typically 20~40 μm apart from the top of the semiconductor layer, defined by a polymer spacer as sealer. The diffusion coefficient of $I3-$ in the electrolyte is less than 10-4 cm2/s at room temperature, which is 2~3 orders of magnitude slower than the electron diffusion coefficient in 1-D semiconductor nanowires (>10-2 cm2/s for ZnO nanowires, for example). Thus, the synchronism of charge carriers (both electrons and holes) transport can no longer be established. As a result, many adverse back electron transfers will take place including the recombination of the electron the semiconductors with dye+ and $I3-$ as well as the formation of dye+-$I3-$ complex.

These dilemmas make it especially necessary to explore further innovations to drastically improve this fascinating photovoltaic device. The aim is (1) to increase the effective semiconductor thickness in the conventional nanoparticle-based DSSC without exceeding the electron diffusion length, (2) to increase the surface roughness of 1-D nanostructured semiconductor without significantly increasing the length, and thus the series resistance; (3) to alter the route of $I^-/I_3^-$ diffusion pathways to catch up with the fast electron transport in the 1-D ordered semiconductor-based photoanode so that the electron/hole transport can be synchronized to exert the advantage of fast electron transport in 1-D photoanode; and (4) to enhance the interfacial rectifying effect to suppress the back electron transfer.

SUMMARY OF THE INVENTION

The present invention presents an improved dye-sensitized solar cell (DSSC) including microtextured TCO glass as an anode, thereby providing a greater surface area to accommodate more $TiO_2$ nanoparticles without increasing the electron transport distance in the $TiO_2$ nanoparticle layer, and resulting in significantly enhanced electron harvest in a traditional $TiO_2$ nanoparticle (NP) DSSC. In addition, the present invention includes a Pt-coated nanoporous anodized aluminum oxide (AAO) placed directly on the $TiO_2$ layer to serve as cathode in order to shorten the distance for hole transport.

The present invention further presents an improved dye-sensitized solar cell (DSSC) that uses a flat TCO as anode, on which an array of free-standing metallic micropillars are deposited to serve as shortcuts for electron diffusion in the nanoparticle network, thereby significantly enhancing the electron harvest beyond that of conventional $TiO_2$ nanoparticle-based dye-sensitized solar cells.

The present invention further presents an improved dye-sensitized solar cell (DSSC) including a nanoscale interdigitated TCO anode and Pt cathode, thereby significantly enhancing the electron and hole transport beyond that of conventional $TiO_2$ nanoparticle-based dye-sensitized solar cells.

The present invention additionally presents a method for manufacturing improved dye-sensitized solar cells (DSSC) including a microtextured TCO comprising the steps of: preparing a photolithographic pattern, applying a reactive ion etching, coating the TCO layer, preparing $TiO_2$ nanocrystalline dye-sensitized solar cells, preparing and fabricating nanoporous platinized counter electrodes (cathode), and assembling a dye-sensitized solar cell.

DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
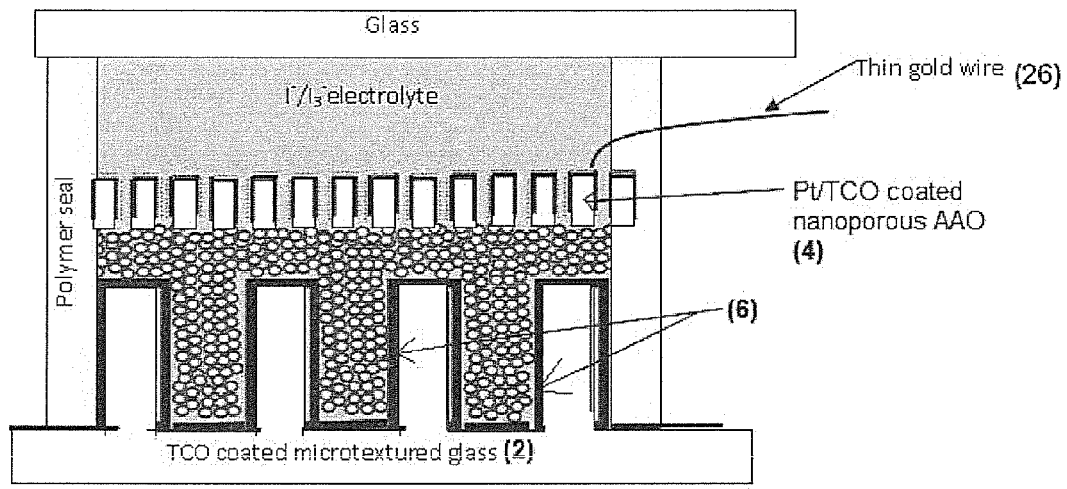
FIG. 1 depicts a Schematic diagram of a DSSC using $TiO_2$ nanoparticles on a microgrooved TCO-coated glass as an anode and a Pt/TCO/AAO (AAO refers to nanoporous anodized aluminum oxide) as a cathode. The cathode is directly placed on the $TiO_2$ nanoparticle layer in order to shorten the transport distance of holes, i.e. the $I^-/I_3^-$ redox shuttle.

The present invention presents an improved dye-sensitized solar cell (DSSC) including (A) a TCO-coated microtextured glass substrate (2) as an electron collecting anode, thereby accommodating more $TiO_2$ nanoparticles per unit substrate area without exceeding the electron diffusion length in the $TiO_2$ nanoparticle layer; (B) free-standing metallic micropillars on the TCO glass, which significantly enhance electron harvest in a traditional $TiO_2$ nanoparticle (NP) DSSC. This array of free-standing metallic micropillars on the transparent conducting anode serve as shortcuts for electron diffusion in the nanoparticle network, thereby significantly enhancing the electron harvest beyond that of conventional $TiO_2$ nanoparticle-based dye-sensitized solar cells; (C) a cathode (4) consisting of a TCO-coated nanoporous substrate by atomic layer deposition method. The TCO coating assures the conductivity of the cathode. Furthermore, scattered Pt nanoparticles are then coated on this TCO layer as catalysts. The cathode is directly placed onto the $TiO_2$ nanoparticle layer as described in (A) and (B). In this way, the hole transport distance (mass flow of redox species) can be significantly shortened to catch up the fast electron transport in (A) and (B); (D) a nanoscale interdigitated anode and cathode, which consists of 1-D TCO and $TiO_2$ concentric nanotubes as an anode; then, interdigitated Pt nanowires are interdigitated in the inner voids of the tubes by electrochemical deposition. This configuration significantly shortens the hole transport (mass flow of redox species) distance to catch up the fast electron transport in the Ti nanotubes.

The present invention additionally presents a method for manufacturing improved dye-sensitized solar cell (DSSC) including free-standing metallic pillars on the TCO comprising the steps of: preparing a photolithographic pattern, electrochemically depositing nickel micropillars, preparing $TiO_2$ nanocrystalline dye-sensitized solar cells, preparing an anode|semiconductor, sensitizing the dye, fabricating platinized counter electrodes, and assembling a dye-sensitized solar cell.

The objective of the present invention is to accelerate both electron and hole collections in a DSSC in a synchronized manner. In particular, for the $TiO_2$ nanoparticle based DSSC, the objective is to utilize a microtextured TCO substrate to increase the effect volume of $TiO_2$ nanoparticle layer and thus the dye-loading amount without increasing the electron transport distance in the $TiO_2$ nanoparticle layer. In addition, the present invention allows for the shortening of the hole transport (mass flow of $I^-/I_3^-$ redox species) distance using a Pt and TCO coated nanoporous substrate (e.g. nanoporous anodized aluminum oxide) that is directly placed on the $TiO_2$ nanoparticle layer, while the nanochannels in AAO are used for the mass flow of $I^-/I_3^-$ redox species. For the 1-D semiconductor-based DSSC, the objective of the present invention is to retain the state-of-the-art strategy of enhancing the electron transfer afforded in ordered 1-D semiconductor structures, while simultaneously reducing the series resistance of the semiconductor without a significant loss of surface roughness compared to 1-D nanowires. Instead of placing all the roughness onto the semiconductor layer, the present invention allocates part of the roughness onto the collecting anode.

Figure 3:
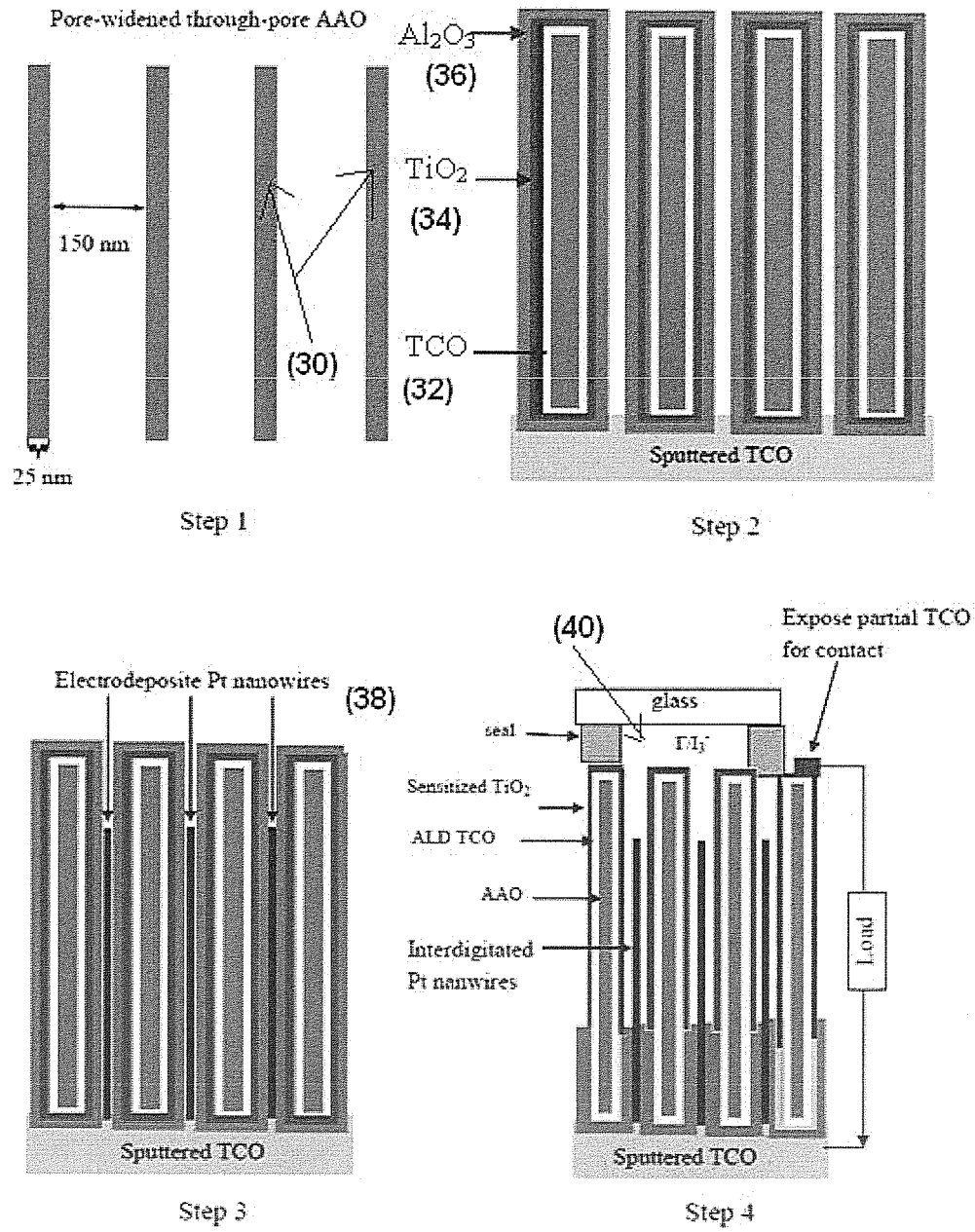
FIG. 3 depicts the fabrication of a 1-D $TiO_2$ nanotube DSSC using AAO as a template. The Pt cathode is interdigitated into the $TiO_2$ nanotubes to drastically reduce the hole (redox species) transport distance, thereby synchronizing the hole transport with the fast electron transport in 1-D $TiO_2$ nanotubes.

A rough collecting anode provides a larger surface area to accommodate more individual 1-D nanoscale semiconductors. Therefore, for the same level of surface roughness factor (SRF, defined as the ratio of the total semiconductor surface area to the nominal planar substrate area), the length of the 1-D semiconductor on a coarsened electron-collecting anode can be relatively shorter than that of conventional 1-D semiconductors supported on a planar anode. Additionally, the present invention allows for the simultaneous shortening of the hole transport distance by interdigitating Pt nanowires in the inner voids of semiconducting nanotubes as shown in FIG. 3.

As illustrated in FIG. 1, the preferred embodiment of the present invention constitutes a microgrooved glass substrate (2). This substrate is fabricated using conventional photolithography methods. In the preferred embodiment the grooves (6) are ~3 µm in width and 3 µm in depth. This configuration provides a 200% increase of the surface area in comparison to a flat glass substrate. The TCO layer (4) is created by sputtering 200 nm indium doped tin oxide (ITO) onto the microgrooved glass substrate. In order to ensure uniform deposition of TCO on all surfaces, the substrate is preferably rotated in a manner known to those of skill in the art. In the preferred embodiment the measure sheet resistance is ~20 Ω/sq.

Figure 2A:
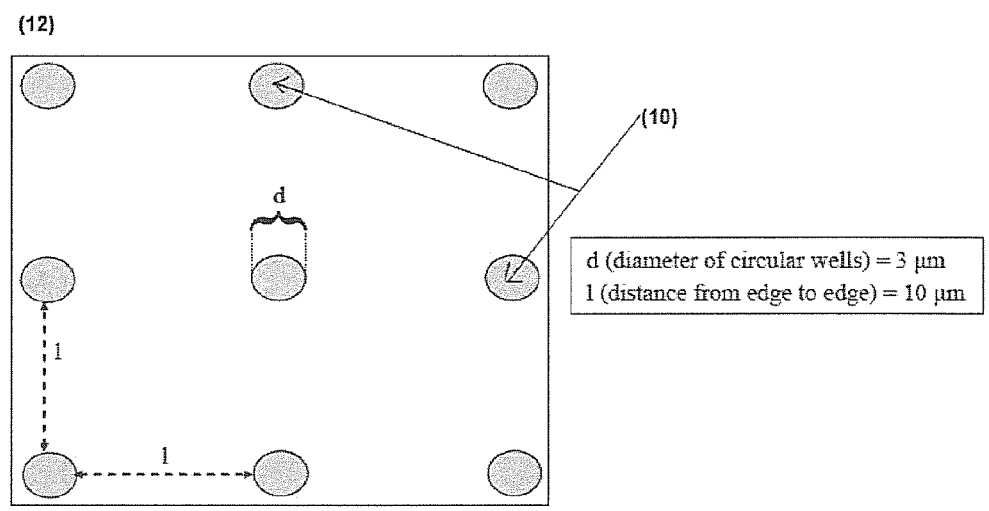
FIG. 2 depicts: (a) a schematic diagram of a flat TCO, on which a square array of metallic micropillars are deposited; (b) a schematic diagram of dye-sensitized solar cells of the present invention imbedded on the $TiO_2$ nanoparticle layer; (c) a scanning electron microscopy (SEM) topview image of the present invention's TCO, on which a square array of metallic micropillars are deposited as electron collectors (Inset shows the SEM cross-section image of the microtextured TCO), and (d) a cross-section SEM image of the Ni micropillars in a ~23 μm thick TiO2 nanoparticle layer.
Figure 2B:
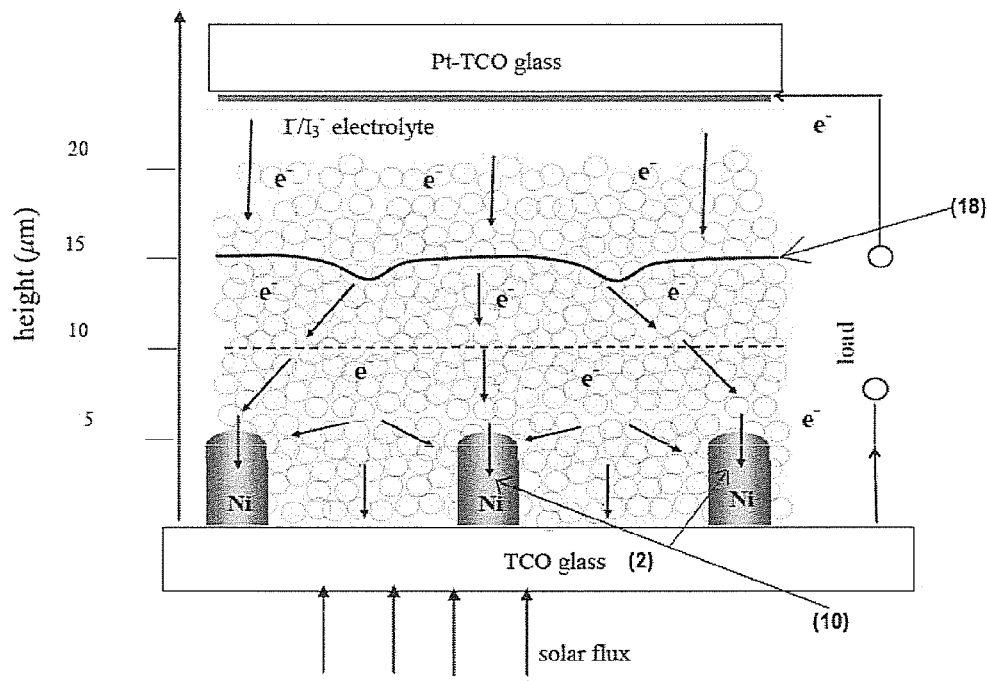

As illustrated in FIGS. 2(a) and (b), the preferred embodiment of the present invention constitutes a square array (12) of metallic micropillars (10) of 5 µm in height h, 3 µm in diameter d and 10 µm in edge-to-edge distance I. It should be noted that while in the preferred embodiment the micropillars of the present invention are arranged in a square array, in alternate embodiments the micropillars may be arranged in any other shape. Additionally, alternate embodiments of the present invention may call for different sized/shaped micropillars. For a 20 µm-thick TiO2 nanoparticle layer, nearly 75% of the nanoparticles will be in 10 µm proximity of the micropillars (10), as indicated by the region under the line (18) in FIG. 2(b). (Area covered by a 10 µm diameter circle with its center moving on the surface of the Ni micropillars). In contrast, only 50% of the nanoparticles are within 10 µm vicinity of the planar TCO (2) (region under the black dashed line). In the preferred embodiment the metallic Ni-micropillar array occupies only ~4.3% of the total TCO area, thereby causing only negligible loss in the optical transparency of the TCO anode.

Figure 2C:
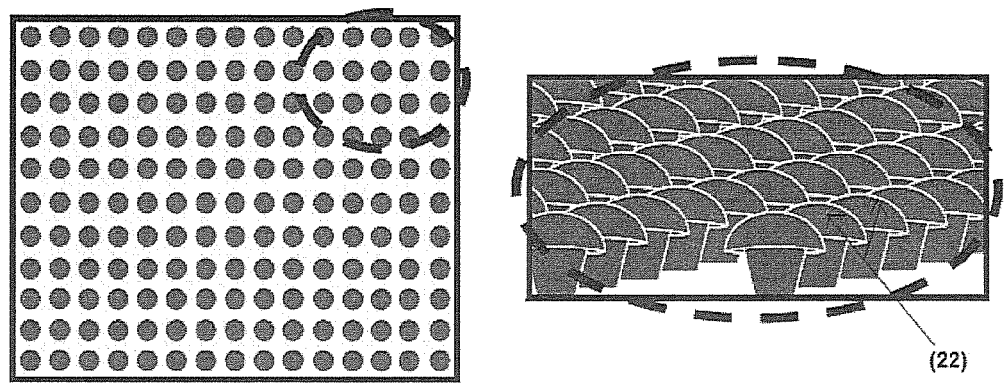
Figure 2D:
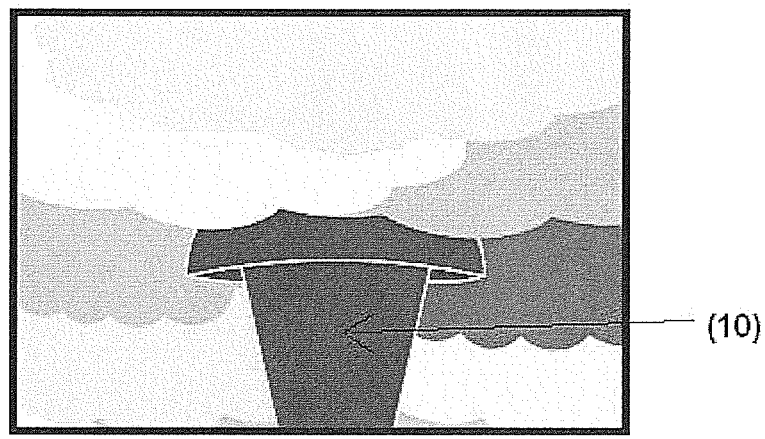

FIG. 2(c) shows the scanning electron microscopy (SEM) top-view and cross-section images of the prepared nickel micropillars on F:SnO2 (FTO) conductive glass. Though the preferred embodiment utilizes nickel as the micropillar material (for its favorable electric contact to TCO), other materials with similar conductive properties (such as Zinc) could be used as well. The Ni-micropillars are fabricated using electronchemical deposition into a photoresist pattern consisting of a square array of circular wells, 3 µm in diameter and 10 µm from edge to edge, and ~3.5 µm in thickness. A small overgrowth out of the well provides an extra ~1.5 µm in height, resulting in the hemispherical heads (22) shown in the inset to FIG. 2(c). TiO$_2$ nanoparticles are dip-coated onto the array using methods known to those of skill in the art. FIG. 2(d) shows SEM cross-section images of Ni micropillars (10) buried in a ~23 µm thick TiO$_2$ nanoparticle layer. The cell is constructed by anchoring Ru N719 dye molecules on the TiO$_2$ nanoparticles, followed by the assembly of spacer, electrolyte and Pt—FTO as cathode using such methods as are known to those of skill in the art.

FIG. 3 shows the fabrication procedures of a one dimensional (1-D) TiO$_2$ nanotube DSSC using nanoporous anodized aluminum oxide (AAO) as a template. The Pt nanowires cathode is interdigitated into the inner voids of the TiO$_2$ nanotubes to drastically reduce the hole (redox species) transport distance, thereby synchronizing the fast electron transport in one dimensional TiO$_2$ nanotubes.

Method and Process of Manufacturing the Present Invention

A. For DSSCs Using Either Microtextured TCO-Coated Glass and/or the Micropillar Array-Deposited TCO (e.g. FTO) Glass as the Electron Collecting Anode and the Nanoporous Membrane as Cathode In the preferred embodiment, the process begins with the preparation of the photolithographic pattern as follows: The FTO glass (e.g., Solaronix) is cleaned in acetone under ultrasonication prior to the spin-coating of photoresist, preferably at 2500 rpm for 30 sec to form a ~3.5 um thick film. The photoresist-coated FTO glass is then soft-baked at 110 degrees C. for 1 minute to drive off excess solvent. After prebaking, the desired photolithographic pattern (area=0.7 cm×0.7 cm) is obtained using a laser writer and developed in developer (Shipley 351:DI water, 1v:3v) for 50 seconds.

The Electrochemical deposition of nickel micropillars then occurs as follows: The growth of Ni miropillars is preferably guided by two-electrode electrochemical deposition. The FTO glass with photolithographic pattern is used as a cathode and a graphite plate is used as counter electrode. Electrodeposition is preferably carried out under room temperature at a cathodic potential of −1.8V in Watts solution (a mixture of 300 g/L NiSO4.6H2O, 45 g/L NiCl2.6H2O, 45 g/L H3BO3, pH=4.5). The micropillars formed are generally approximately 5 µm tall when filling up the 3.5 µm deep microwells followed by a small overgrowth out of the well to gain an extra ~1.5 µm height, which led to the formation of hemispherical heads at the top. Lift-off is accomplished by immersing the sample in acetone for 5 minutes. The resulting slightly conic shape is ascribed to the inevitable intensity gradient of UV light in the photoresist during the exposure.

The microtextured glass is fabricated using conventional photolithography method. The photomask is customer-designed. The microgrooves were etched by reactive ion etching. A TCO layer is coated by sputtering method.

The TiO$_2$ nanoparticle film and assembly of the TiO$_2$ nanocrystalline dye-sensitized solar cells are then preferably prepared as follows: A slurry solution of TiO$_2$ nanoparticle is preferably prepared by grinding a mixture of 50 mg TiO$_2$ (anatase nanopowder, ~25 nm), 1.25 ml water, 0.6 µl acetylacetone and 3 µl Triton X-100. Tape is used to define the area on the microgrooved TCO-coated glass, or the micropillar-deposited FTO glass to be coated with TiO$_2$ film. A doctor blade is used to define the thickness of the applied slurry thickness which is typically 25 µm. The sample is then dried at room temperature for 30 minutes prior to sintering at 450 degrees C. for 30 minutes. This process generally yields a 20~25 µm thick TiO$_2$ with good filling in the microgrooves. After cooling the sample, the sample is soaked overnight under dark in a 0.5 mM solution of cis-bis(isothiocyanato)bis (2,2'-bipyridyl-4,4'-dicarboxylato)-ruthenium(II) bis-tetrabutylammonium (N719) in absolute ethanol. In darkness, the sample is then rinsed with ethanol for 30 minutes to remove non-chemisorbed dye molecules.

The cathode is prepared using Whatman's nanoporous anodized aluminum oxide membrane as substrate. Then, 200 nm ITO is coated on one side of the substrate surface (or the entire surface of the membrane by atomic layer deposition method). Next, 5 nm Pt is sputtered on one side of the substrate (or the entire surface of the membrane is coated with Pt nanoclusters by soaking the membrane in a $H_2PtCl_6$ in ethanol solution and sintered at 300 C to reduce $H_2PtCl_6$ into Pt). A thin metal wire (26) (such as silver or gold) is attached to the cathode surface using silver paste or a wire bonder for electrical contact. These two kinds of cathodes can be directly placed atop the $TiO_2$ nanoparticle layer. The internal space of the cell is filled with an electrolyte (0.5 M LiI, 50 mM I2, 0.5 M 4-tertbutylpyridine in 3-methoxypropionitrile) by capillary action. The cell is sealed with a polymer sealant (Surlyn, 25 μm thick, Solaronix).

B. A DSSC using Nanoscale Interdigitated Anode and Cathode

As illustrated in FIG. 3, all surfaces of the AAO membrane (Whatman) (30) are first coated with a 20 nm thick TCO (typically, ITO layer) as electron-collecting anode using the atomic layer deposition (ALD) method (32). Next, a 20 nm $TiO_2$ layer (34) is deposited on all surfaces (via the ALD method) as an electron harvesting semiconducting layer. Subsequently, an insulating $Al_2O_3$ layer (36) is coated by atomic layer deposition. Then, a TCO (e.g. ITO) is sputtered to one side of the AAO template to close off the holes. Then, Pt nanowires (38) are deposited into the nanotubes using pulse AC electrochemical deposition method (Step 3). To free the TiO2 surface, the previously coated $Al_2O_3$ is selectively etched off in 1M NaOH solution. Then, the surface of TiO2 is sensitized with solar absorbing dye molecules (e.g. N719 dye), followed by filling the voids with redox electrolyte solutions (40).

The invention has been described in an illustrative manner, and it is to be understood that the terminology used is intended to be in the nature of words of description rather than of limitation.

Obviously, many modifications and variations of the present invention are possible in light of the above teachings. It is, therefore, to be understood that within the scope of the appended claims, the invention may be practiced otherwise than as specifically described.

What is claimed is:

1. A highly efficient dye-sensitized solar cell comprising:
    a transparent conducting anode comprising a transparent conducting oxide on a glass,
    an array of metallic micropillars in direct contact with said anode,
    a layer of semiconducting nanoparticles on said anode, and
    a cathode oriented in direct contact with said nanoparticles, wherein the micropillars are completely buried in the layer of semiconducting nanoparticles.

2. The solar cell of claim 1, wherein the transparent conducting anode is microtextured.

3. The solar cell of claim 2, wherein said transparent conducting anode comprises the transparent conducting oxide coated on a microtextured glass.

4. The solar cell of claim 3, wherein said transparent conducting oxide comprises indium tin oxide.

5. The solar cell of claim 2, wherein the transparent conducting anode is microgrooved.

6. The solar cell of claim 2, wherein the micropillars comprise nickel or zinc.

7. The solar cell of claim 2, wherein the metallic micropillars are in contact with the semiconducting nanoparticles.

8. The solar cell of claim 7, wherein the layer of semiconducting nanoparticles is sintered.

9. The solar cell of claim 8, wherein the metallic micropillars extend away from the anode.

10. The solar cell of claim 2, wherein said semiconducting nanoparticles comprise $TiO_2$.

11. The solar cell of claim 2, wherein said cathode comprises a Pt-coated nanoporous anodized aluminum oxide (AAO).

12. The solar cell of claim 1, wherein said micropillars have hemispherical tips.

13. The solar cell of claim 1, wherein said transparent conducting oxide comprises indium tin oxide.

14. The solar cell of claim 1, wherein said semiconducting nanoparticles comprise $TiO_2$.

15. The solar cell of claim 1, wherein said cathode comprises a Pt-coated nanoporous anodized aluminum oxide (AAO).

16. The solar cell of claim 1, wherein the micropillars comprise nickel or zinc.

17. The solar cell of claim 1, wherein the metallic micropillars are in contact with the semiconducting nanoparticles.

18. The solar cell of claim 1, wherein the layer of semiconducting nanoparticles is sintered.

19. The solar cell of claim 1, wherein the metallic micropillars extend away from the anode.

* * * * *

UNITED STATES PATENT AND TRADEMARK OFFICE
CERTIFICATE OF CORRECTION

PATENT NO. : 9,129,751 B2  Page 1 of 1
APPLICATION NO. : 12/748856
DATED : September 8, 2015
INVENTOR(S) : Tao Xu It is certified that error appears in the above-identified patent and that said Letters Patent is hereby corrected as shown below:

Title page

Page 2, References Cited (56)
Column 1, line 65, please delete "comparision" and insert --comparison--

Page 3, References Cited (56)
Column 1, line 44, please delete "1000 pm" and insert --1000 μm--

Page 5, References Cited (56)
Column 1, line 62, please delete "I⁻I₃⁻" and insert --I⁻-I₃⁻--

Page 6, References Cited (56)
Column 1, line 40, please delete "TiCI₄" and insert --TiCl₄--

Page 7, References Cited (56)
Column 2, lines 33-34, please delete "self-addembled" and insert --self-assembled--
Column 2, line 50, please delete "Hydroxamatte" and insert --Hydroxamate--
Column 2, line 67, please delete "pp. pp." and insert --pp.--

Page 8, References Cited (56)
Column 1, line 16, please delete "X. Tu," and insert --Tu, X.--
Column 2, line 60, please delete "nanostructructured" and insert --nanostructured--

Signed and Sealed this
Sixteenth Day of February, 2016

Michelle K. Lee
*Director of the United States Patent and Trademark Office*